(12) United States Patent
Peng et al.

(10) Patent No.: US 12,500,106 B2
(45) Date of Patent: Dec. 16, 2025

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Hsuan-Ying Peng, Hsinchu (TW); Chin-Szu Lee, Taoyuan (TW); Chiang Hsien Shih, Hsinchu (TW); Chih-Chang Wu, Hsinchu (TW); Che-Wei Tung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 878 days.

(21) Appl. No.: 17/661,838

(22) Filed: May 3, 2022

(65) Prior Publication Data

US 2023/0360944 A1    Nov. 9, 2023

(51) Int. Cl.
*H01L 21/68*      (2006.01)
*G05B 19/418*    (2006.01)
(Continued)

(52) U.S. Cl.
CPC ............ *H01L 21/68* (2013.01); *G05B 19/418* (2013.01); *H01L 21/68764* (2013.01);
(Continued)

(58) Field of Classification Search
CPC ............... H01L 21/68; H01L 21/68764; H01L 21/76846; H01L 21/76877;
(Continued)

(56) References Cited

U.S. PATENT DOCUMENTS

| | | | |
|---|---|---|---|
| 5,556,476 A | * | 9/1996 | Lei ................... H01L 21/68792 |
| | | | 118/728 |
| 8,898,889 B2 | | 12/2014 | Nam et al. |

(Continued)

FOREIGN PATENT DOCUMENTS

| | | | | |
|---|---|---|---|---|
| JP | 2005-117007 | * | 4/2005 | ............. H01L 21/68 |
| JP | 2006-332244 | * | 12/2006 | ........... H01L 21/304 |

(Continued)

*Primary Examiner* — Bret P Chen
(74) *Attorney, Agent, or Firm* — Harrity & Harrity, LLP

(57) ABSTRACT

Some implementations described herein provide a deposition tool that includes a grounding component between an edge ring of a substrate stage and a pumping plate component. The grounding component includes a grounding strap having a deformation region. The deformation region includes a recessed edge to reduce a likelihood of the grounding strap rubbing against a surface of the pumping plate component during operation of the deposition tool. Material properties of the grounding strap may reduce a likelihood of plastic deformation of the grounding strap during repeated cycling. In this way, an amount of particulates dislodged from the surface of the pumping plate component may be decreased to improve a yield of semiconductor product fabricated using the deposition tool. Furthermore, a frequency of servicing the grounding component may be decreased to decrease a downtime of the deposition tool and increase a throughput of semiconductor product fabricated using the deposition tool.

20 Claims, 13 Drawing Sheets

500

510 — Transmit, to a positioning system of a deposition tool, a first signal to cause the positioning system to raise a semiconductor substrate carried by a substrate stage to a deposition region in which a pumping plate component is configured to draw a flow of a gas over the semiconductor substrate during a deposition operation 520 — Transmit, to the positioning system, a second signal to lower the semiconductor substrate from the deposition region

(51) Int. Cl.
*H01L 21/687* (2006.01)
*H01L 21/768* (2006.01)

(52) U.S. Cl.
CPC ............... *G05B 2219/40066* (2013.01); *H01L 21/76846* (2013.01); *H01L 21/76877* (2013.01)

(58) Field of Classification Search
CPC ......... H01L 21/76807; H01L 21/76814; H01L 23/53238; G05B 19/418; G05B 2219/40066
See application file for complete search history.

(56) References Cited

U.S. PATENT DOCUMENTS

| | | |
|---|---|---|
| 9,382,621 B2 | 7/2016 | Choi et al. |
| 11,315,812 B2 | 4/2022 | Fujikata et al. |
| 2008/0152464 A1* | 6/2008 | Li .................... C23C 16/045 414/217 |
| 2008/0187682 A1* | 8/2008 | Park .................... C23C 16/4401 118/723 R |
| 2020/0161093 A1* | 5/2020 | Li .................... H01J 37/32174 |

FOREIGN PATENT DOCUMENTS

| | | | | |
|---|---|---|---|---|
| JP | 4119551 B2 * | 5/2008 | ......... | H01L 21/3065 |
| KR | 10-2167687 * | 10/2020 | ........... | C23C 16/458 |
| TW | I527930 B | 4/2016 | | |
| TW | 201842428 A | 12/2018 | | |

\* cited by examiner

SEMICONDUCTOR PROCESSING TOOL AND METHODS OF OPERATION

BACKGROUND

Chemical vapor deposition (CVD) is a chemical process used in the semiconductor industry to produce thin films. In CVD, a semiconductor wafer (substrate) is exposed to one or more volatile precursors, which react and/or decompose on the substrate surface to produce the thin film. As the geometries of features on the semiconductor wafer are reduced, more complex CVD processes may be required to obtain operational circuits at the reduced feature size. The complex CVD processes may rely on processes performed in vacuums and with tools that may also be more complex and compact.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
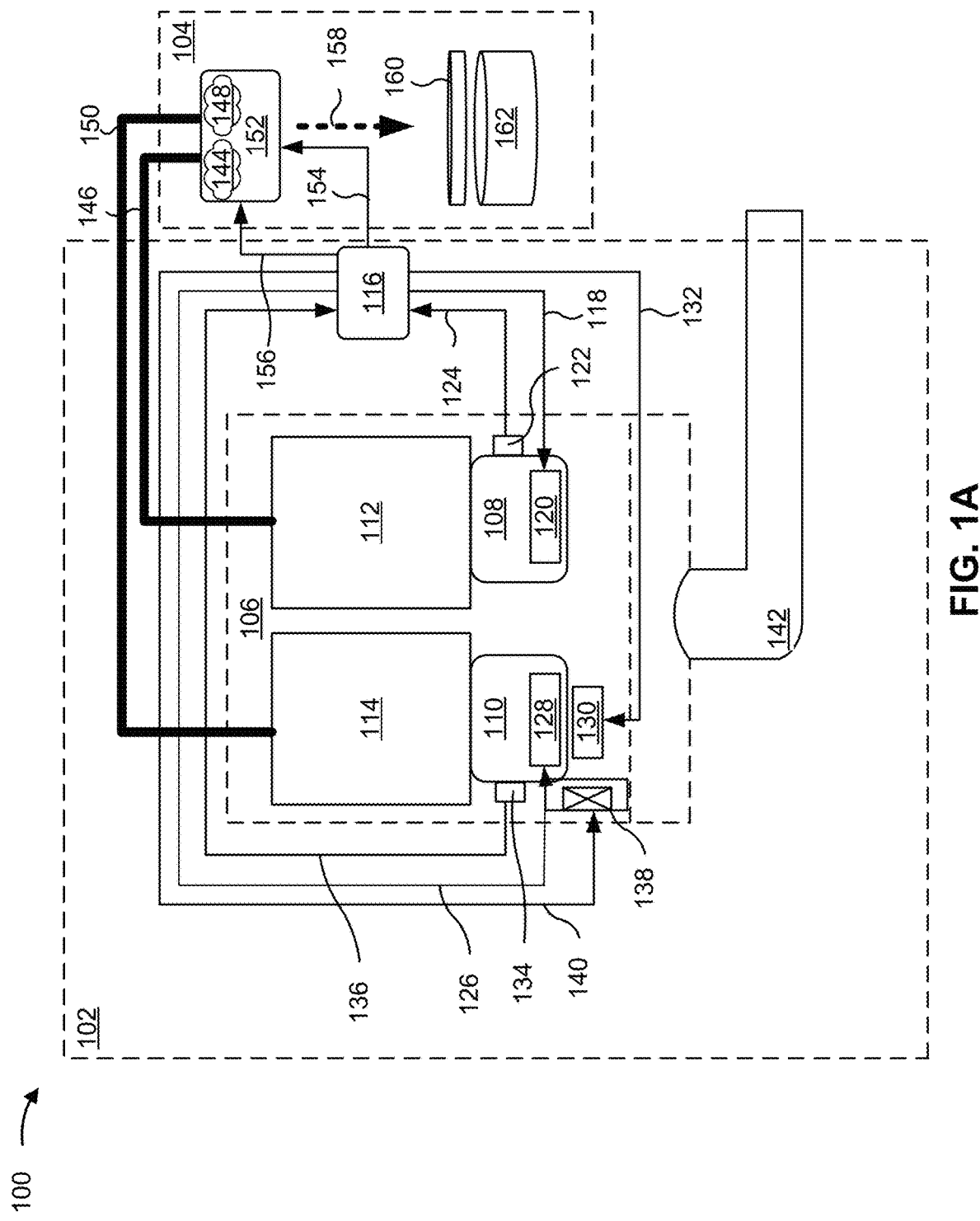
FIGS. 1A-1C are diagrams of an example deposition tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a deposition tool may include a grounding component between an edge ring of a substrate stage and a pumping plate component. The grounding component may be compliant and include a grounding strap. As the substrate stage rises to position a semiconductor substrate in a deposition region, the grounding strap may compress between a protrusion of the edge ring and an under-side surface of an overhang region of the pumping plate component to discharge a plasma residual charge. The grounding strap may include a shape and/or a material that results in a lateral deflection of the grounding strap during compression, resulting in the grounding strap rubbing against a vertical surface of the pumping plate component. The rubbing may dislodge particulates from the vertical surface of the pumping plate component and contaminate the semiconductor substrate, reducing a yield of semiconductor product fabricated using the deposition tool. Furthermore, the material of the grounding strap may include one or more mechanical properties that cause plastic deformation of the grounding strap and exacerbate the rubbing. Such plastic deformation may increase a frequency of servicing the grounding component to increase a downtime of the deposition tool and reduce a throughput of semiconductor product fabricated using the deposition tool.

Some implementations described herein provide a deposition tool that includes a grounding component between an edge ring of a substrate stage and a pumping plate component. The grounding component includes a grounding strap having a deformation region. The deformation region includes a recessed edge to reduce a likelihood of the grounding strap rubbing against a surface of the pumping plate component during operation of the deposition tool. Material properties of the grounding strap may reduce a likelihood of plastic deformation of the grounding strap during repeated cycling. In this way, an amount of particulates dislodged from the surface of the pumping plate component may be decreased to improve a yield of semiconductor product fabricated using the deposition tool. Furthermore, a frequency of servicing the grounding component may be decreased to decrease a downtime of the deposition tool and increase a throughput of semiconductor product fabricated using the deposition tool.

Figure 1B:
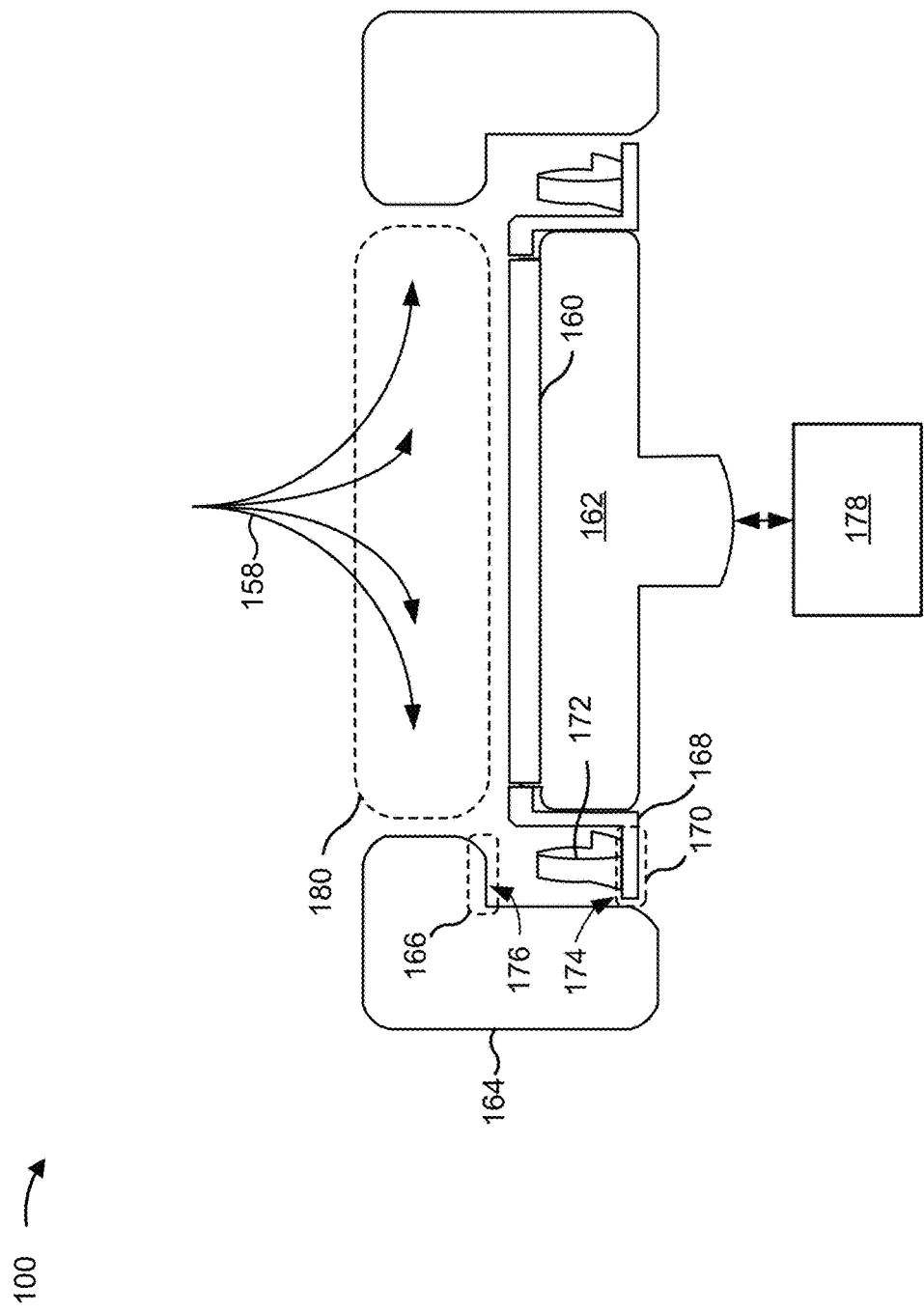
Figure 1C:
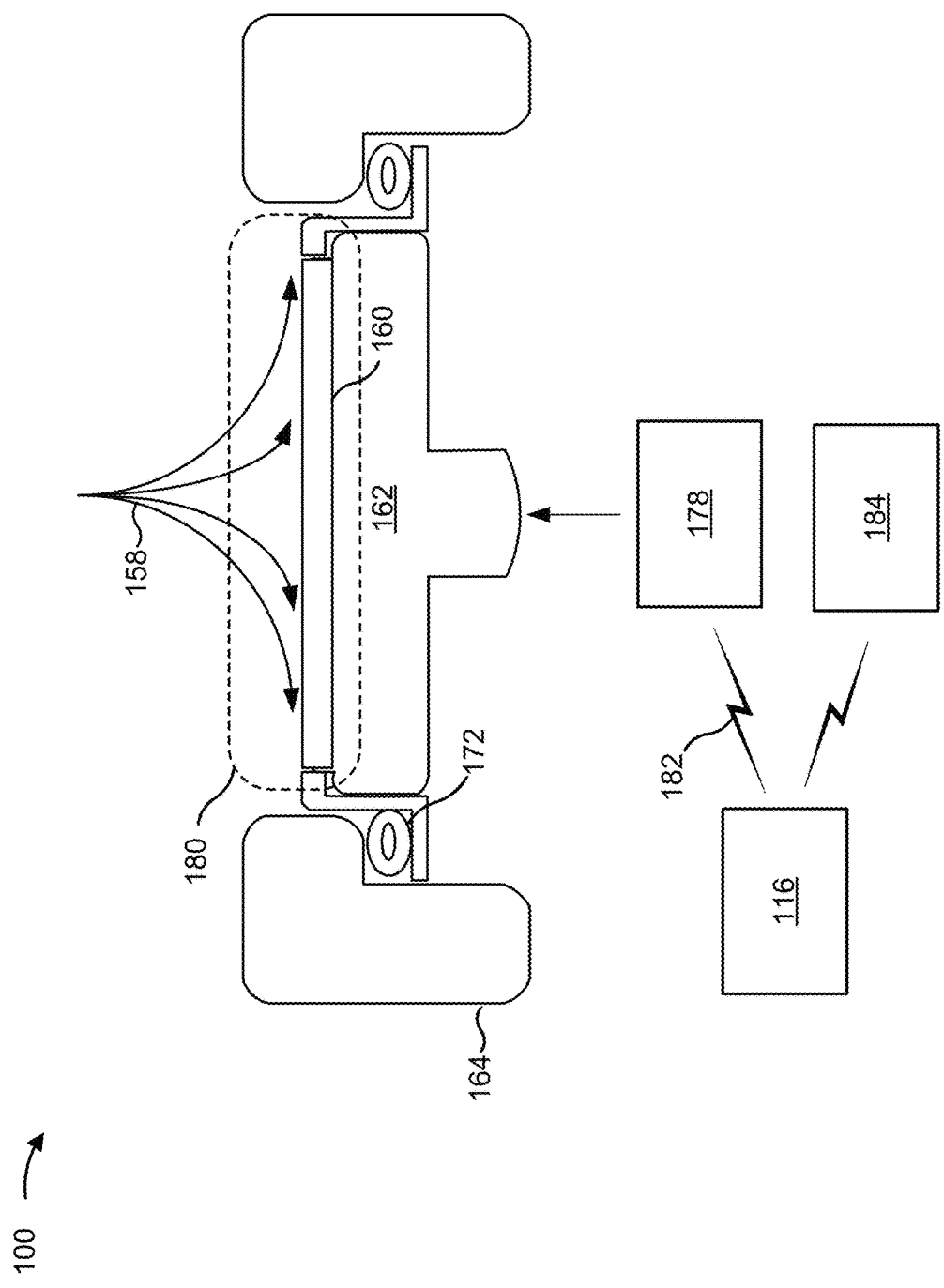

FIGS. 1A-1C are diagrams of an example deposition tool 100 described herein. As described, the deposition tool 100 includes a dual ampoule system 102 and a processing chamber 104. The dual ampoule system 102 generates one or more precursor gasses (or precursor vapors), one or more carrier gasses, and/or one or more other types of gasses for use in a deposition operation associated with one or more semiconductor substrates in the processing chamber 104. As shown in FIG. 1A, the ampoule system 102 includes the dual ampoule assembly 106 including a first ampoule 108 and a second ampoule 110.

In some implementations, the dual ampoule assembly 106 further includes a first hot can 112 located above and coupled to the first ampoule 108. The dual ampoule assembly 106 further includes a second hot can 114 located above and coupled to the second ampoule 110. The first hot can 112 and the second hot can 114 respectively surround valves and gas lines associated with gas inlets and outlets to the respective first ampoule 108 and the second ampoule 110. The first hot can 112 and the second hot can 114 provide a heated environment for the valves and the gas lines to reduce condensation in the valves and the gas lines as a result of an ambient temperature around the deposition tool 100.

In some implementations, the dual ampoule system 102 includes a controller 116. The controller 116 is a processor for carrying out programmed operations. The controller 116 is configured to operate one or more components of the deposition tool 100. In some implementations, the controller 116 provides one or more signals indicative of a first ampoule temperature setpoint associated with the first ampoule 108 and a second ampoule temperature setpoint associated with the second ampoule 110.

In some implementations, the controller 116 provides an indication of the first ampoule temperature setpoint in a first ampoule control signal 118 to the first ampoule heating element 120 in the first ampoule 108. The first ampoule control signal 118 includes a voltage, a current, a resistance, a digital communication, or another type of indication of the first ampoule temperature setpoint. For example, the controller 116 provides the first ampoule control signal 118 to cause a first ampoule heating element 120 of the first ampoule 108 to generate heat based on the first ampoule temperature setpoint associated with the first ampoule 108. The first ampoule heating element 120 generates heat at the first ampoule 108 to cause a temperature at the first ampoule 108 to achieve, satisfy, or reach the first ampoule target temperature based on the first ampoule temperature setpoint. The heat is generated in an amount to cause the first precursor to be heated to the first ampoule target temperature to generate the first precursor gas. The first ampoule target temperature is based on a volatility temperature of the first precursor used in the first ampoule 108. The volatility temperature is a temperature at which a material in a non-gaseous state transitions to a gaseous state or vapor.

In some implementations, the controller 116 is configured to receive first ampoule sensor data associated with a first ampoule ambient temperature measured at the first ampoule 108. The dual ampoule system 102 includes a first ampoule temperature sensor 122 associated with the first ampoule 108 and configured to generate the first ampoule sensor data. The first ampoule temperature sensor 122 may include a thermocouple, a thermistor, an infrared (IR) sensor, a resistive temperature device (RDT), or another type of temperature sensor coupled to, integrated with, or otherwise associated with the first ampoule 108. In operation, the first ampoule temperature sensor 122 senses (e.g., measures or detects) the first ampoule ambient temperature at the first ampoule 108 and provides the first ampoule ambient temperature as the first ampoule sensor data. The first ampoule sensor data may include a voltage, a current, a resistance, a digital communication, or another type of indication of the first ampoule ambient temperature. The controller 116 receives an indication of the first ampoule sensor data in a first ampoule sensor signal 124. The controller 116 compares the first ampoule sensor data and the first ampoule target temperature. Based on a result of the comparison, the controller 116 adjusts the first ampoule temperature setpoint to cause the first ampoule ambient temperature at the first ampoule 108 to achieve, satisfy, or reach the first ampoule target temperature.

In some implementations, the controller 116 provides an indication of the second ampoule temperature setpoint in a second ampoule control signal 126 to a second ampoule heating element 128 in the second ampoule 110. The second ampoule control signal 126 includes a voltage, a current, a resistance, a digital communication, or another type of indication of the second ampoule temperature setpoint. For example, the controller 116 provides the second ampoule control signal 126 to cause the second ampoule heating element 128 of the second ampoule 110 to generate heat based on the second ampoule temperature setpoint associated with the second ampoule 110. The second ampoule heating element 128 generates heat at the second ampoule 110 to cause a temperature at the second ampoule 110 to achieve, satisfy, or reach the second ampoule target temperature based on the second ampoule temperature setpoint. The heat is generated in an amount to cause the second precursor to be heated to the second ampoule target temperature to generate the second precursor gas. The second ampoule target temperature is based on a volatility temperature of the second precursor used in the second ampoule 110. As described, the volatility temperature is a temperature at which a material in a non-gaseous state transitions to a gaseous state or vapor.

In some implementations, the dual ampoule assembly 106 includes a cooling element 130. In an example, the cooling element 130 includes a thermoelectric cooler such as a Peltier cooling device, or another type of cooling device. The cooling element 130 is configured to cool the second ampoule 110 to reduce the temperature of the second ampoule 110. The controller 116 may control the cooling element 130 to maintain the second ampoule 110 at the second ampoule target temperature. The controller 116 generates a cooling element control signal 132 that is used to maintain the second ampoule 110 at the second ampoule target temperature or to reduce the temperature of the second ampoule 110 to the second ampoule target temperature. The cooling element control signal 132 includes a voltage, a current, a resistance, a digital communication, or another type of indication of the second ampoule target temperature. For example, the controller 116 provides the cooling element control signal 132 to the cooling element 130 to cause the cooling element 130 of the second ampoule 110 to cool the second ampoule 110 based on the second ampoule target temperature. The cooling element 130, in response to the cooling element control signal 132, absorbs heat at the second ampoule 110 to cause a temperature at the second ampoule 110 to achieve, satisfy, or reach the second ampoule target temperature.

In some implementations, the controller 116 is configured to receive second ampoule sensor data associated with a second ampoule ambient temperature measured at the second ampoule 110. The dual ampoule system 102 includes a second ampoule temperature sensor 134 associated with the second ampoule 110 and configured to generate the second ampoule sensor data. The second ampoule temperature sensor 134 may include a thermocouple, a thermistor, an IR sensor, an RDT, or another type of temperature sensor coupled to, integrated with, or otherwise associated with the second ampoule 110. In operation, the second ampoule temperature sensor 134 senses (e.g., measures or detects) a second ampoule ambient temperature at the second ampoule 110 and provides the second ampoule ambient temperature as the second ampoule sensor data. The second ampoule sensor data may include a voltage, a current, a resistance, a digital communication, or another type of indication of the second ampoule ambient temperature. The controller 116 receives an indication of the second ampoule sensor data in a second ampoule sensor signal 136. The controller 116 compares the second ampoule sensor data and the second ampoule target temperature. Based on a result of the comparison, the controller 116 adjusts the second ampoule temperature setpoint to cause the second ampoule ambient temperature at the second ampoule 110 to achieve, satisfy, or reach the second ampoule target temperature.

In some implementations, the dual ampoule assembly 106 includes a fan 138. In some implementations, the fan 138 may be a variable speed fan where a speed is configurable based on a control signal. In some implementations, the fan 138 may be a single speed fan where the fan 138 may be activated or deactivated based on a control signal. The fan 138 may be positioned within the dual ampoule assembly 106 adjacent to the first ampoule 108 and/or the second ampoule 110. The fan 138 is configurable to provide airflow within the dual ampoule assembly 106. The controller 116 provides a fan control signal 140 to the fan 138. In response to the fan control signal 140, the fan 138 operates and provides airflow around the second ampoule 110 and/or the first ampoule 108. The fan control signal 140 includes a voltage, a current, a resistance, a digital communication, or another type of control signal.

The dual ampoule system 102 further includes an exhaust line 142 configured to allow the airflow generated by the fan 138 to exit the dual ampoule system 102. In some implementations, the exhaust line 142 is located below and between the first ampoule 108 and the second ampoule 110 to enable the airflow around the first ampoule 108 and/or the second ampoule 110 to be selectively exhausted through the exhaust line 142.

The first ampoule 108 generates a first precursor gas 144 that is provided through a first gas line 146 to the processing chamber 104. The second ampoule 110 generates a second precursor gas 148 that is provided through a second gas line 150 to the processing chamber 104. In some implementations, the first ampoule 108 and the second ampoule 110 are operated to concurrently generate the first precursor gas 144 and the second precursor gas 148, respectively. In some implementations, the first precursor gas 144 includes a ruthenium (Ru) precursor. In some implementations, the ruthenium (Ru) precursor includes $\eta^4$-2,3-dimethylbutadiene ruthenium tricarbonyl (Ru(DMBD)(CO)$_3$) and/or another ruthenium precursor. In some implementations, the second precursor gas 148 includes a tantalum nitride (TaN) precursor. In some implementations, the tantalum nitride (TaN) precursor includes other tantalum precursors such as tert-butylimidotris (diethylamido) tantalum [($^t$BuN)(NEt$_2$)$_3$Ta, TBTDET], ammonia (NH$_3$), Ta(NEt$_2$)$_2$Cl$_2$(p-Me$_2$Npy)$_2$, and/or Ta(NEt$_2$)$_2$(NCy$_2$)$_2$, among other examples. The types of precursors identified above are intended as examples of precursors that could be used and other types of precursors may be used in the deposition tool 100.

In some implementations, the first precursor gas 144 and the second precursor gas 148 are provided to the same processing chamber 104 (e.g., a single processing chamber 104 of the deposition tool 100). In some implementations, the first precursor gas 144 and the second precursor gas 148 are provided to the same processing chamber 104 for use in the same deposition operation. In some implementations, the first precursor gas 144 and the second precursor gas 148 are provided to the same processing chamber 104 for use in different deposition operations. In some implementations, the first precursor gas 144 and the second precursor gas 148 are provided to the same processing chamber 104 for a deposition operation in which the first precursor gas 144 and the second precursor gas 148 are used to form or deposit the same layer or structure (e.g., the same barrier layer, the same seed layer, the same semiconductor structure) on a semiconductor substrate. In some implementations, the first precursor gas 144 and the second precursor gas 148 are provided to the same processing chamber 104 for a deposition operation in which the first precursor gas 144 and the second precursor gas 148 are used to form or deposit different layers or structures (e.g., different barrier layers, different seed layers, different semiconductor structures) on a semiconductor substrate. In some implementations, the first precursor gas 144 and the second precursor gas 148 are provided to different processing chambers 104 for different deposition operations.

In some implementations, the processing chamber 104 includes a mixer 152 coupled to the first gas line 146 and the second gas line 150. The mixer 152 includes a gas mixer or a gas blender device and possibly one or more supporting devices, such as one or more sensors. The controller 116 transmits a mixer control signal 154 to cause the mixer 152 to form a mixed precursor gas 158 from the first precursor gas 144 and the second precursor gas 148. The mixer control signal 154 includes a voltage, a current, a resistance, a digital communication, or another type of control signal. The controller 116 transmits a valve control signal 156 to cause the mixed precursor gas 158 to be provided into the processing chamber 104 (e.g., into a single processing chamber of the deposition tool 100) such that the mixed precursor gas 158 is deposited on a semiconductor substrate 160. The valve control signal 156 includes a voltage, a current, a resistance, a digital communication, or another type of control signal. The mixed precursor gas 158 may include a mixture of a ruthenium precursor gas and a tantalum nitride precursor gas, or a mixture of other precursor gasses. The mixed precursor gas 158 may be provided into the processing chamber 104 to form a barrier layer (e.g., for use in forming the same barrier layer) that includes ruthenium and tantalum nitride (Ru(TaN)) or another compound material. The semiconductor substrate 160 is supported in the processing chamber 104 by a substrate stage 162. The substrate stage 162 includes a pedestal, an electrostatic chuck (e-chuck), a mechanical chuck, a vacuum chuck, or another type of device that is capable of supporting the semiconductor substrate 160.

FIG. 1B shows additional details of the deposition tool 100. The substrate stage 162 may include one or more heating elements to heat the semiconductor substrate 160 during a deposition operation. As an example, the one or more heating elements may heat the semiconductor substrate 160 to a temperature that is included in a range of approximately 200 degrees Celsius (° C.) to approximately 250° C. However, other values and ranges for the temperature are within the scope of the present disclosure.

One or more portions of a pumping plate component 164 may be adjacent to portions of an outer perimeter of the substrate stage 162. The pumping plate component 164 may include, as an example, an annular ring portion having orifices or ports distributed around an interior perimeter of the annular ring portion. The pumping plate component 164 may draw the mixed precursor gas 158 across a surface of the semiconductor substrate 160 during a deposition operation. The pumping plate component 164 may also include an overhang region 166.

An edge ring 168 may be attached to the perimeter of the substrate stage 162. The edge ring 168 may include, for example, a stainless steel or other metallic material that is electrically conductive. As shown, the edge ring 168 includes a protrusion 170 that extends outwardly from an outer perimeter of the substrate stage 162.

FIG. 1B further shows a grounding component 172. As described in greater detail in connection with FIGS. 2A-2C, the grounding component 172 may include a grounding strap having one or more dimensional properties and formed in an approximate elliptical shape. The grounding component 172 may be compliant (e.g., compressible between a top-side surface 174 of the protrusion 170 and an under-side surface 176 of the overhang region 166). The grounding component 172 may include an electrically-conductive material configured to discharge a plasma residual charge from the substrate stage 162 and/or the semiconductor substrate 160 during the deposition operation.

A positioning system 178 may be mechanically coupled to the substrate stage 162. The positioning system 178 may include, as an example, a combination of one or more of a ball-screw component, a servo motor, a pneumatic cylinder, or a linear bearing, among other examples. The positioning system 178 may raise the substrate stage 162 to position the semiconductor substrate 160 within a deposition region 180 during the deposition operation. The positioning system 178 may also lower the substrate stage 160 to remove the semiconductor substrate 160 from the deposition region 180 upon completion of the deposition operation.

As shown in FIG. 1C, the controller 116 may transmit signals to, and/or receive signals from, the positioning system 178 using one or more communication links 182 (e.g., one or more wireless-communication links, one or more wired-communication links, or a combination of a wireless-communication link and a wired-communication link). The signals may include individual signals, combinations or sequences of signals, analog signals, digital signals, digital communications, and/or other types of signals.

Such signals may cause the positioning system 178 to perform an operation. For example, a signal from the controller 116 to the positioning system 178 may cause the positioning system 178 to raise the substrate stage 162 carrying the semiconductor substrate 160 to the deposition region 180. As shown, and while the substrate stage 162 is raised, the grounding component 172 (e.g., a grounding strap of the grounding component 172) is in a compressed state to close an electrically-conductive path between the substrate stage 162 and the pumping plate component 164. Another signal from the controller 116 to the positioning system 178 may cause the positioning system 178 to lower the substrate stage 162 and cause the grounding component 172 to become uncompressed and open the electrically-conductive path.

The controller 116 may also perform one or more operations related to maintenance of the grounding component 172. For example, the controller 116 may use a machine-learning model. The machine-learning model may include and/or may be associated with one or more of a neural network model, a random forest model, a clustering model, or a regression model, among other examples. In some implementations, the controller 116 uses the machine-learning model to determine that the grounding component 172 needs servicing by providing candidate compressive cycle, electrical contact resistance, deposition recipes, or detected semiconductor substrate contamination parameters as input to the machine-learning model, and using the machine-learning model to determine a likelihood, probability, or confidence that a particular outcome has occurred (e.g., the grounding component 172 is damaged or has exceeded an expected useful life). In some implementations, the controller 116 provides a contamination parameter (e.g., a particulate threshold) as input to the machine-learning model, and the controller 116 uses the machine-learning model to determine or identify a particular combination of compressive cycles and/or deposition recipes that are likely to exceed the contamination parameter.

The controller 116 (or another system) may train, update, and/or refine the machine-learning model to increase the accuracy of the outcomes and/or parameters determined using the machine-learning model. The controller 116 may train, update, and/or refine the machine-learning model based on feedback and/or results from the subsequent deposition operation, as well as from historical or related deposition operations (e.g., from hundreds, thousands, or more historical or related deposition operations) performed by the deposition tool 100.

The controller 116 may further transmit signals to and/or receive signals from a notification system 184 using the one or more communication links 182. The notification system 184 may include a visual component (e.g., a status indicator light or a graphical user interface, among other examples) and/or an audio component (e.g., a speaker or a buzzer, among other examples).

For example, the controller 116 may, using the machine learning model, determine that the grounding component 172 needs to be serviced (e.g., replaced, cleaned, or reattached, among other examples). The controller 116 may then transmit a signal to cause the notification system 184 to output a notification that grounding component 172 needs to be serviced. Such a notification may be visual (e.g., illuminate the status indicator light or generate a message on the graphical user interface) or audible (e.g., play a warning message through the speaker or activate the buzzer), among other examples.

The number and arrangement of devices shown in FIGS. 1A-1C are provided as one or more examples. In practice, there may be additional devices, fewer devices, different devices, or differently arranged devices than those shown in FIGS. 1A-1C. Furthermore, two or more devices shown in FIGS. 1A-1C may be implemented within a single device, or a single device shown in FIGS. 1A-1C may be implemented as multiple, distributed devices. Additionally, or alternatively, a set of devices (e.g., one or more devices) of the deposition tool 100 may perform one or more functions described as being performed by another set of devices of the deposition tool 100.

Figure 2A:
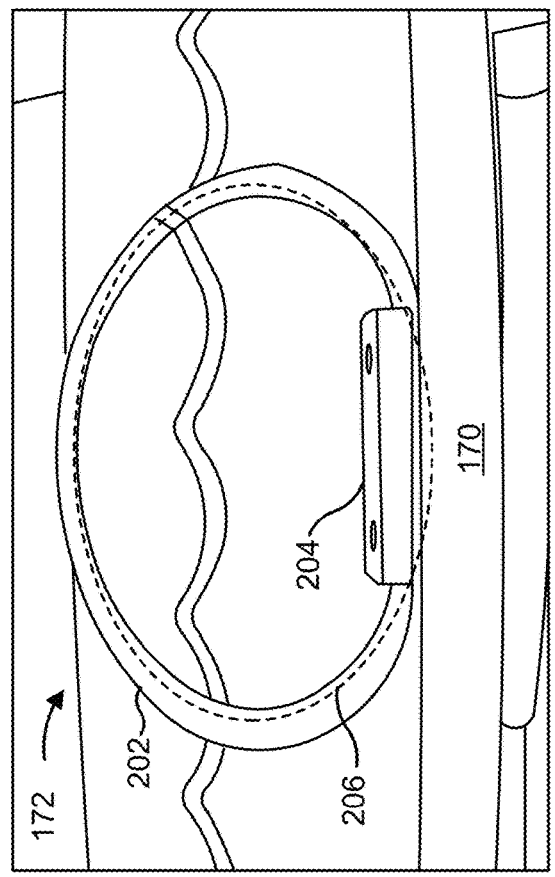
FIGS. 2A-2C are diagrams of an example implementation of a grounding component described herein.
Figure 2B:
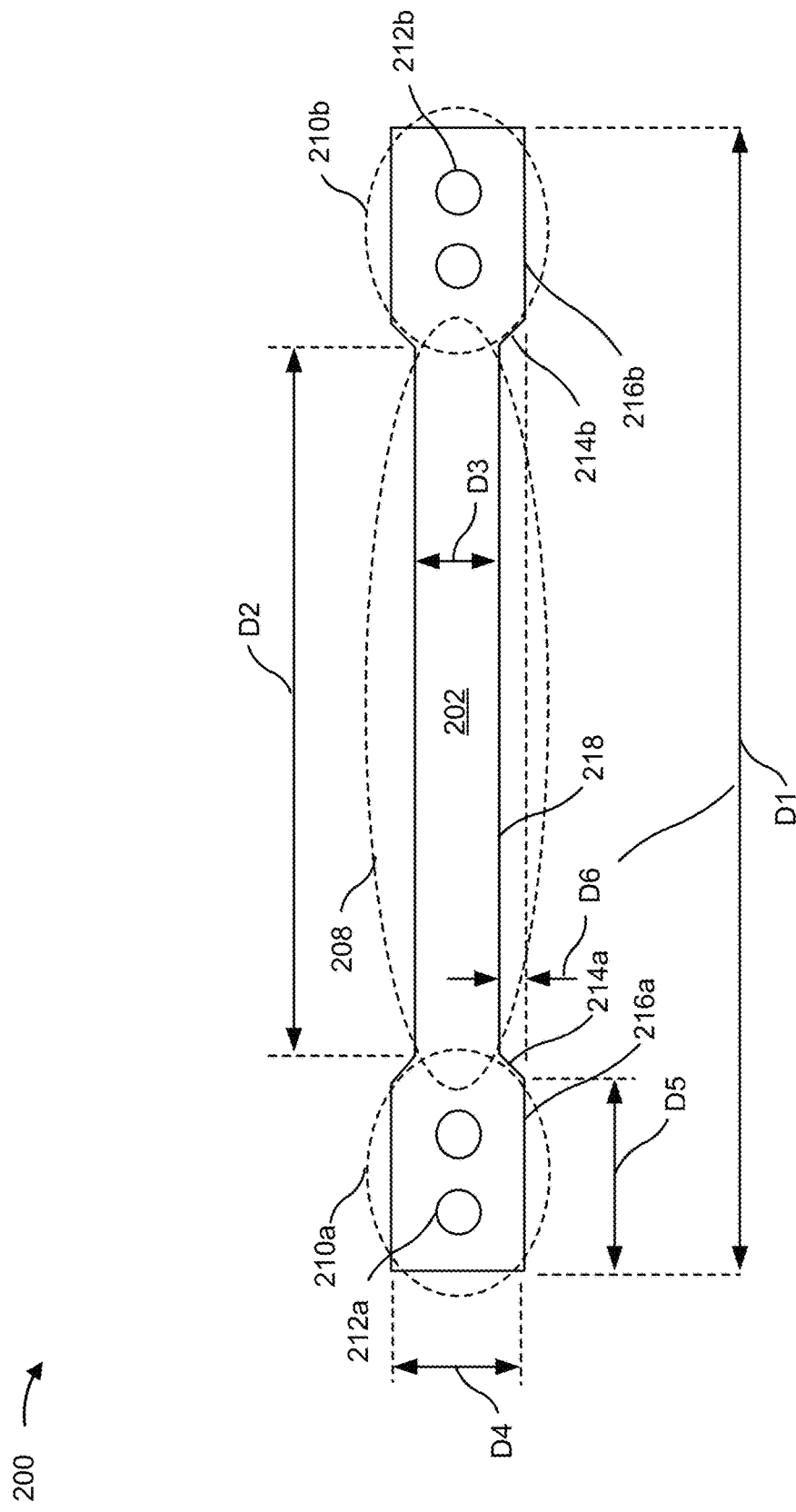
Figure 2C:
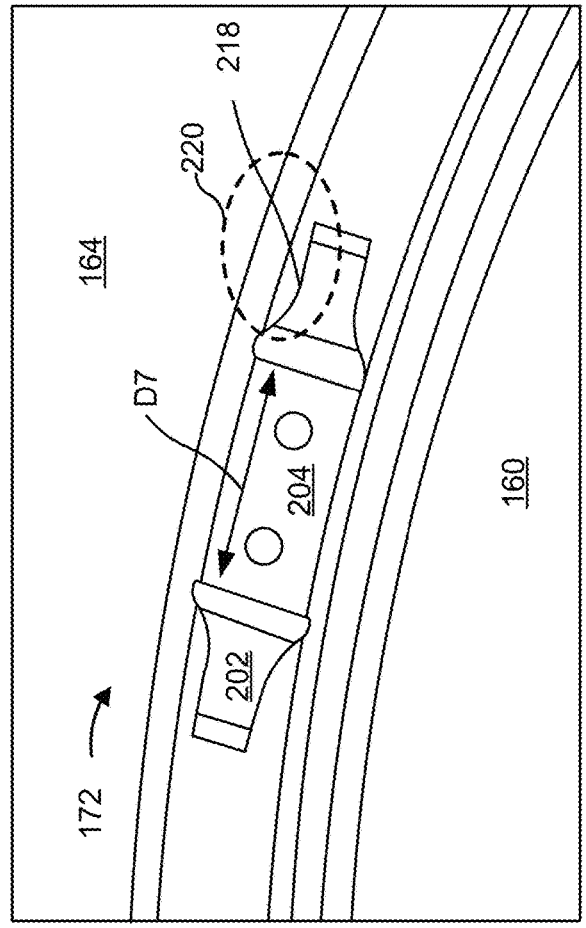

FIGS. 2A-2C are diagrams of an example implementation 200 of the grounding component 172 described herein. As shown in FIG. 2A, the grounding component 172 includes a grounding strap 202 and a coupling component 204. The coupling component 204 may couple opposing ends of the grounding strap 202 to form an elliptical portion 206. In some implementations, the coupling component 204 attaches to the protrusion 170 using a fastener such as a screw, a pin, or a rivet, among other examples. Additionally, or alternatively, the coupling component 204 may attach to the protrusion 170 using an epoxy or a welding. The elliptical portion 206 may be compliant and have an effective spring constant to generate a contact force between the grounding strap 202 and the under-side surface 176 of the overhang region 166.

FIG. 2B shows example details of the grounding strap 202. The grounding strap 202 may include a material such as a type 301 stainless steel material. Additionally, or alternatively, the material may include one or more physical properties. For example, the grounding strap 202 may include a material having a tensile strength greater than approximately 200 megapascals, a modulus of elasticity greater than approximately 100 gigapascals, and/or a Brinell hardness number greater than approximately 100. A material that is deficient in one or more of these properties (e.g., has a lesser value) may cause the grounding strap 202 to become plastically deformed during use, rupture during use, or experience a shortened useful life. However, other values for the tensile strength, the modulus of elasticity, and the Brinell hardness number are within the scope of the present disclosure.

The material may also, or alternatively, have an electrical conductivity that is greater than approximately $0.9 \times 10^6$ siemens per meter. A material that is deficient in this property (e.g., has a lesser value) may cause the grounding strap 202 to be ineffective in discharging a plasma residual charge from the substrate stage 162 and/or the semiconductor substrate 160. However, other values for the electrical conductivity are within the scope of the present disclosure.

The grounding strap 202 may include one or more regions. For example, the grounding strap 202 may include a deformation region 208. The grounding strap 202 may also include a pair of attach regions at opposing ends of the grounding strap (e.g., an attach region 210a and an attach region 210b). The deformation region 208 may between the attach region 210a and the attach region 210b.

The attach region 210a may include a pair of alignment holes 212a. The attach region 210b may include a pair of alignment holes 212b. The elliptical portion 206 may be formed by overlapping, and attaching, the pair of attach regions (e.g., the attach region 210a and the attach region 210b) to the protrusion 170 using the pair of alignment holes 212a and the pair of alignment holes 212b.

The grounding strap 202 may include a lead-in 214a from an edge 216a of the attach region 210a. The grounding strap 202 may further include a lead-in 214b from an edge 216b of the attach region 210b. The lead-in 214a and the lead-in 214b may create a recessed edge 218 within the deformation region 208. Although shown as approximately linear in FIG. 2B, one or more of the lead-ins 214a or 214b may include a curvature for stress relief purposes.

In some implementations, the grounding strap 202 and/or regions of the grounding strap 202 include one or more dimensional properties. For example, the grounding strap 202 may include a length D1 that is included in a range of approximately 108.9 millimeters to approximately 133.1 millimeters. If the length D1 is less than approximately 108.9 millimeters, increased bending stresses within the elliptical portion 206 may cause plastic deformation during compression. If the length D1 is greater than approximately 133.1 millimeters, an effective spring constant of the elliptical portion 206 may be decreased to reduce a contact force between the grounding strap 202 and the under-side surface 176 of the overhang region 166 during compression. However, other values and ranges for the length D1 are within the scope of the present disclosure.

Additionally, or alternatively, the deformation region 208 may include a length D2 that is included in a range of approximately 70.2 millimeters to approximately 85.8 millimeters. If the length D2 is less than approximately 70.2 millimeters, a diameter of the elliptical portion 206 may be decreased, rendering the elliptical portion 206 less compatible with a vertical throw of positioning system 178 to prevent the grounding strap 202 from engaging with the under-side surface 176 of the overhang region 166 as the substrate stage 162 is raised. If the length D2 is greater than approximately 85.8 millimeters, a diameter of the elliptical portion 206 may be increased, rendering the elliptical portion 206 less compatible with a vertical throw of positioning system 178 to prevent the grounding strap 202 from disengaging with the under-side surface 176 of the overhang region 166 as the substrate stage 162 is lowered. However, other values and ranges for the length D2 are within the scope of the present disclosure.

Additionally, or alternatively, the deformation region 208 may include a width D3 that is lesser relative to a width D4 of the attach region 210a (and/or the attach region 210b). For example, the width D3 may be included in range of approximately 5.9 millimeters to approximately 7.3 millimeters, and the width D4 may be included in a range of approximately 9.6 millimeters to approximately 11.3 millimeters.

If the width D3 is less than approximately 5.9 millimeters, an effective spring constant of the elliptical portion 206 may be decreased to reduce a contact force between the grounding strap 202 and the under-side surface 176 of the overhang region 166 during compression. If the width D3 is greater than approximately 7.3 millimeters, a likelihood of the deformation region 208 contacting the vertical surface of the pumping plate component 164 may increase to increase a dislodging of particulates and contamination within the deposition tool 100. However, other values and ranges for the width D3 are within the scope of the present disclosure.

If the width D4 is less than approximately 9.6 millimeters, a strength and/or stability of the attach region 210a (and/or the attach region 210b) may be decreased and cause an instability of the grounding component 172. If the width D4 is greater than approximately 11.3 millimeters, a likelihood of the attach region 210a (and/or the attach region 210b) contacting the vertical surface of the pumping plate component 164 may increase to increase a dislodging of particulates and contamination within the deposition tool 100. However, other values and ranges for the width D4 are within the scope of the present disclosure.

Additionally, or alternatively, the attach region 210a (and/or the attach region 210b) may include a length D5 that is in a range of approximately 18.0 millimeters to approximately 22.0 millimeters. If the length D5 is less than approximately 18.0 millimeters, a strength and/or stability of the attach region 210a (and/or the attach region 210b) may be decreased and cause an instability of the grounding component 172. If the length D5 is greater than approximately 22.0 millimeters, the length D2 of the deformation region 208 may be decreased to increase a bending stress within the elliptical portion 206 and cause plastic deformation during compression. However, other values and ranges for the length D5 are within the scope of the present disclosure.

Additionally, or alternatively, the recessed edge 218 may include a depth D6 (e.g., an offset from the edge 214a) that is included in a range of approximately 1.8 millimeters to approximately 2.2 millimeters. If the depth D6 is less than approximately 1.8 millimeters, a likelihood of the deformation region 208 contacting the vertical surface of the pumping plate component 164 may not be decreased and contamination conditions within the deposition tool 100 may remain. If the depth D6 is greater than approximately 2.2 millimeters, a contact area of the grounding strap 202 may be decreased to cause insufficient electrical contact between the grounding strap 202 and the under-side surface 176 of the overhang region 166 during compression. However, other values and ranges for the depth D6 are within the scope of the present disclosure.

FIG. 2C shows a bottom view of the grounding component 172, including the grounding strap 202 and the coupling component 204 (FIG. 2C omits the protrusion 170 for clarity). As shown, the recessed edge 218 broadens a gap 220 to reduce a likelihood of the recessed edge 218 (e.g., the deformation region 208) from contacting the vertical surface of the pumping plate component 164 and dislodging particulates to cause contamination within the deposition tool 100.

As shown in FIG. 2C, the coupling component 204 may include a dimensional property corresponding to a length D7. The length D7 may be included in a range of approximately 18.0 millimeters to approximately 22.0 millimeters. If the length D7 is less than approximately 18.0 millimeters, a diameter of the elliptical portion 206 may be increased, rendering the elliptical portion 206 less compatible with a vertical throw of positioning system 178 to prevent the grounding strap 202 from disengaging with the under-side surface 176 of the overhang region 166 as the substrate stage 162 is lowered. If the length D7 is greater than approximately 22.0 millimeters, a diameter of the elliptical portion 206 may be decreased, rendering the elliptical portion 206 less compatible with a vertical throw of positioning system 178 to prevent the grounding strap 202 from engaging with under-side surface 176 of the overhang region 166 as the substrate stage 162 is raised.

As shown in connection with FIGS. 2A-2C, and elsewhere herein, a grounding strap (e.g., the grounding strap 202) includes a first attach region (e.g., the attach region 210a) at a first end of the grounding strap and a second attach region (e.g., the attach region 210b) at a second end of the grounding strap. In some implementations, the second end is opposite the first end. The grounding strap includes a deformation region (e.g., the deformation region 208) between the first attach region and the second attach region. In some implementations, a first lead-in (e.g., the lead-in 214a) from a first edge (e.g., the edge 216a) of the first attach region and a second lead-in (e.g., the lead-in 214b) from a second edge (e.g., the edge 216b) of the second attach region create a recessed edge (e.g., the recessed edge 218) within the deformation region. In some implementations, the first attach region and the second attach region are configured to attach to a protrusion (e.g., the protrusion 170) of an edge ring (e.g., the edge ring 168) of a deposition tool (e.g., the deposition tool 100) to create an elliptical portion (e.g., the elliptical portion 206) of a grounding component (e.g., the grounding component 172) that includes the recessed edge.

Additionally, or alternatively, a deposition tool (e.g., the deposition tool 100) includes a pumping plate component (e.g., the pumping plate component 164). In some implementations, the pumping plate component includes an overhang region (e.g., the overhang region 166) extending towards a deposition region (e.g., the deposition region 180) of the deposition tool. The deposition tool includes a substrate stage (e.g., the substrate stage 162) configured to position a semiconductor substrate (e.g., the semiconductor substrate 160) within the deposition region. The deposition tool further includes an edge ring (e.g., the edge ring 168). In some implementations, the edge ring includes a protrusion (e.g., the protrusion 170) extending outwards from an outer perimeter of the substrate stage. The deposition tool further includes a grounding component (e.g., the grounding component 172) between a top-side surface (e.g., the top-side surface 174) of the protrusion and an under-side surface (e.g., the under-side surface 176) of the overhang region. In some implementations, the grounding component includes a grounding strap (e.g., the grounding strap 202) forming an approximate elliptical shape (e.g., the elliptical portion 206) in a vertical plane between the edge ring and the pumping plate component. In some implementations, the grounding strap includes a deformation region (e.g., the deformation region 208) having a width (e.g., the width D3) that is lesser relative to a width of one or more of a pair of attach regions (e.g., the width D4 of the attach regions 210a, 210b) at opposing ends of the grounding strap.

Additionally, or alternatively, a method is performed. The method includes transmitting, by a controller (e.g., the controller 116) to a positioning system (e.g., the positioning system 178) of a deposition tool (e.g., the deposition tool 100), a first signal to cause the positioning system to raise a semiconductor substrate (e.g., the semiconductor substrate 160) carried by a substrate stage (e.g., the substrate stage 162) to a deposition region (e.g., the deposition region 180) in which a pumping plate component (e.g., the pumping plate component 164) is configured to draw a flow of a gas (e.g., the mixed precursor gas 158) over the semiconductor substrate during a deposition process. In some implementations, an edge ring (e.g., the edge ring 168) is attached to the substrate stage. In some implementations, the edge ring includes a protrusion (e.g., the protrusion 170) extending outwardly from an outer perimeter of the substrate stage. In some implementations, a grounding component (e.g., the grounding component 172) is between a top-side surface (e.g., the top-side surface 174) of the protrusion and an under-side surface (e.g., the under-side surface 176) of an overhang region (e.g., the overhang region 166) of the pumping plate component. In some implementations, the grounding strap component includes a grounding strap (e.g., the grounding strap 202) and a coupling component (e.g., the coupling component 204) that couples attach regions (e.g., the attach regions 210a, 210b) at opposing ends of the grounding strap to form an elliptical portion (e.g., the elliptical portion 206) of the grounding component. In some implementations, the grounding strap includes a deformation region (e.g., the deformation region 208) including at least one recessed edge (e.g., the recessed edge 218) along the elliptical portion. The method further includes transmitting, by the controller to the positioning system, a second signal to lower the semiconductor substrate from the deposition region.

As indicated above, FIGS. 2A-2C are provided as examples. Other examples may differ from what is described with regard to FIGS. 2A-2C.

FIGS. 3A-3E are diagrams of an example implementation 300 of the deposition tool 100 including the grounding component 172 described herein. The example implementation 300 may be an example of forming a dual damascene structure, although formation of other structures are also within the scope of the disclosure. In some implementations, the deposition tool 100 performs one or more of the processes and/or operations described in connection with FIGS. 3A-3E.

While forming the dual damascene structure, use of the grounding component 172 as described in connection with FIGS. 1B-2C may reduce contamination within layers of the damascene structure and/or reduce downtime of the deposition tool 100.

Figure 3A:
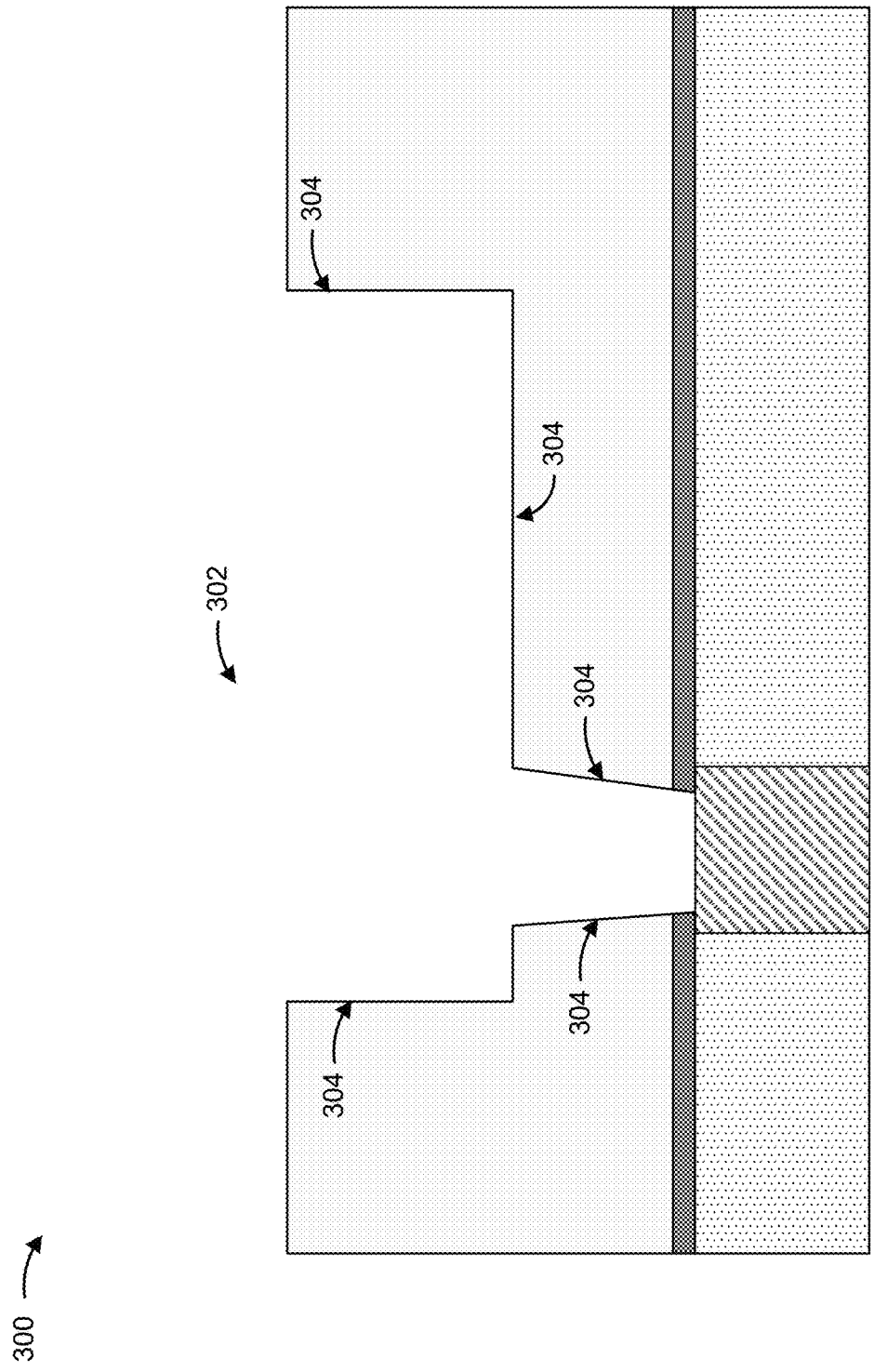
FIGS. 3A-3E are diagrams of an example implementation of the deposition tool including the grounding component described herein.

Turning to FIG. 3A, the dual damascene structure may be formed in a recess 302. The recess 302 may be formed using various semiconductor processing techniques, including photoresist formation techniques, developer techniques, exposure techniques, and/or etching techniques, among other examples. The recess 302 may be formed in a dielectric layer (e.g., an interlayer dielectric (ILD) layer or another type of dielectric layer) over and to a conductive structure. The conductive structure may include a metal gate, a source/drain contact, an interconnect structure, a via, a metal line, or another type of conductive structure included in a semiconductor device. The recess 302 includes a lower portion having one or more surfaces 304, and an upper portion having one or more surfaces 304. The lower portion includes a portion of the recess 302 in which a "via" portion of the dual damascene structure is to be formed. The upper portion includes a portion of the recess 302 in which the "metal line" portion of the dual damascene is to be formed.

A pre-clean operation is performed to clean the one or more surfaces 304 in the recess 302 (e.g., after formation of the recess 302). The pre-clean operation may include positioning the semiconductor substrate 160 in a processing chamber 104. The processing chamber 104 may be pumped down to a partial vacuum, and the surfaces 304 are cleaned using a plasma-based and/or a chemical-based pre-clean agent. The pre-clean operation is performed to clean (e.g., remove) oxides and other contaminants or byproducts from the surfaces 304.

Figure 3B:
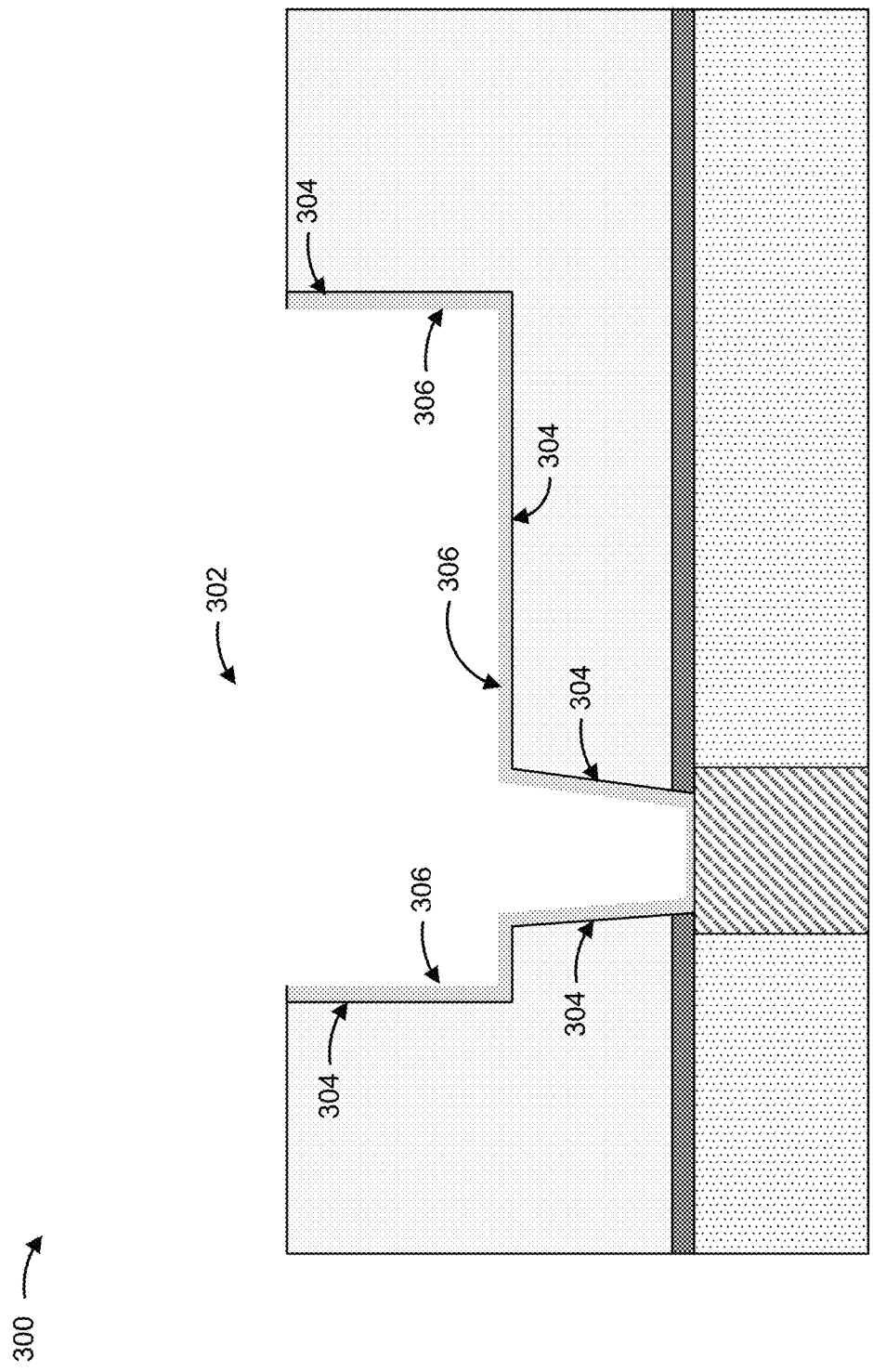

FIG. 3B is a diagram of an example deposition operation. In some implementations, the deposition operation is performed to form a barrier layer 306 on the surfaces 304. The barrier layer 306 is formed to promote adhesion between the dual damascene structure that is to be formed in the recess 302 and the surfaces 304, to prevent material migration between the dual damascene structure and the surfaces 304, and/or for another purpose.

The barrier layer 306 is formed from the mixed precursor gas 158 using a deposition process described herein with respect to the deposition tool 100. The mixed precursor gas 158 may include a first precursor gas (e.g., the first precursor gas 144) comprised of a ruthenium (Ru) precursor gas, and a second precursor gas (e.g., the second precursor gas 148) comprised of a tantalum nitride (TaN) precursor gas. Accordingly, the barrier layer 306 may include a ruthenium and tantalum nitride (Ru(TaN)) layer. Furthermore, and as a result of the deposition tool 100 using the grounding component 172 as described herein, the barrier layer 306 may be free of contaminants and/or particulates.

Figure 3C:
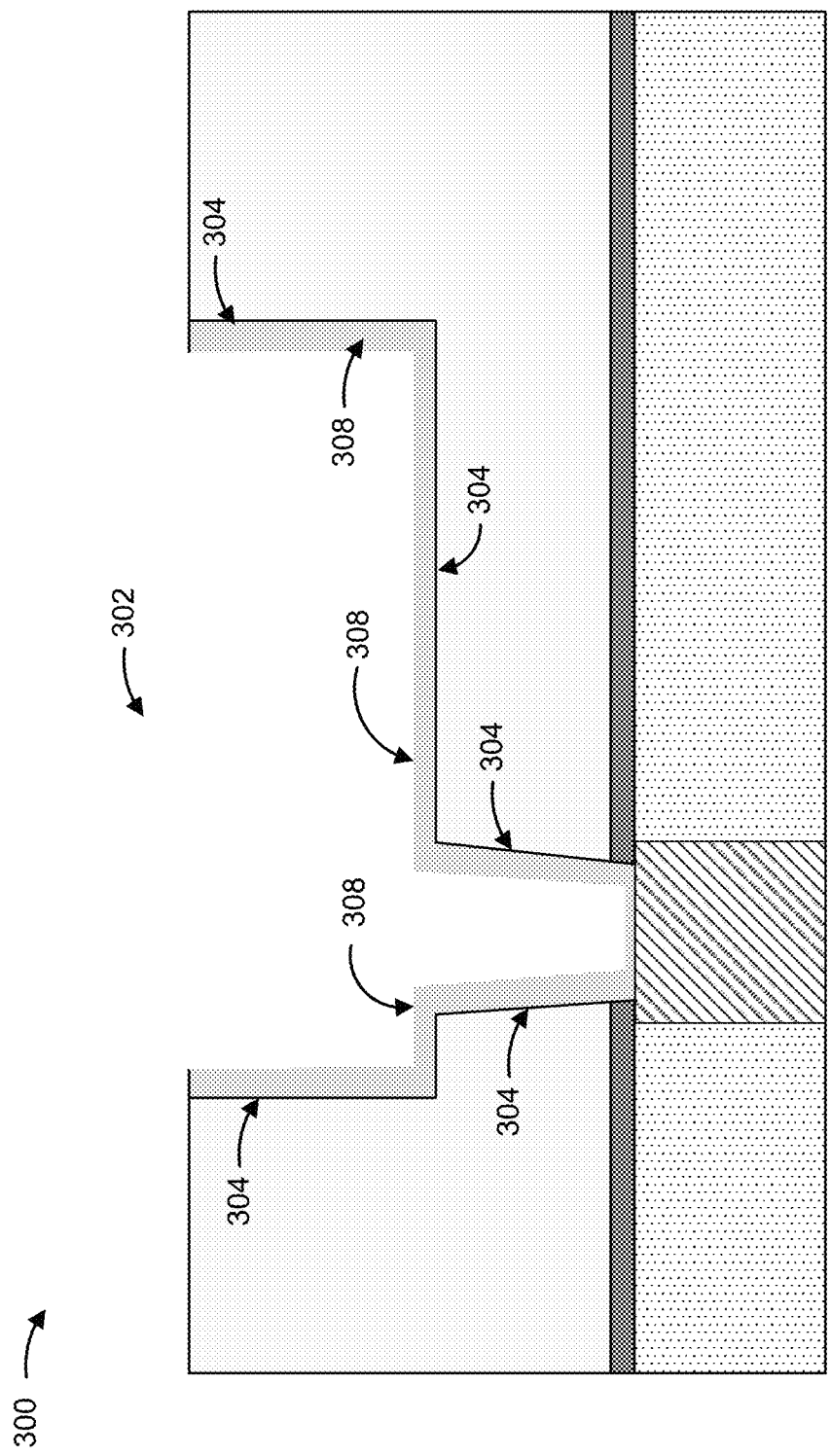

FIG. 3C is a diagram of an example deposition operation. In some implementations, the deposition operation is performed to form a barrier layer 308 on the barrier layer 306. The barrier layer 308 may include a tantalum nitride ($Ta_xN_y$) barrier layer, a titanium nitride ($Ti_xN_y$) barrier layer, or another type of barrier layer. The barrier layer 308 may be deposited using a CVD technique, a PVD technique, an ALD technique, and/or another deposition technique. Furthermore, and as a result of the deposition tool 100 using the grounding component 172 as described herein, the barrier layer 308 may be free of contaminants and/or particulates.

Figure 3D:
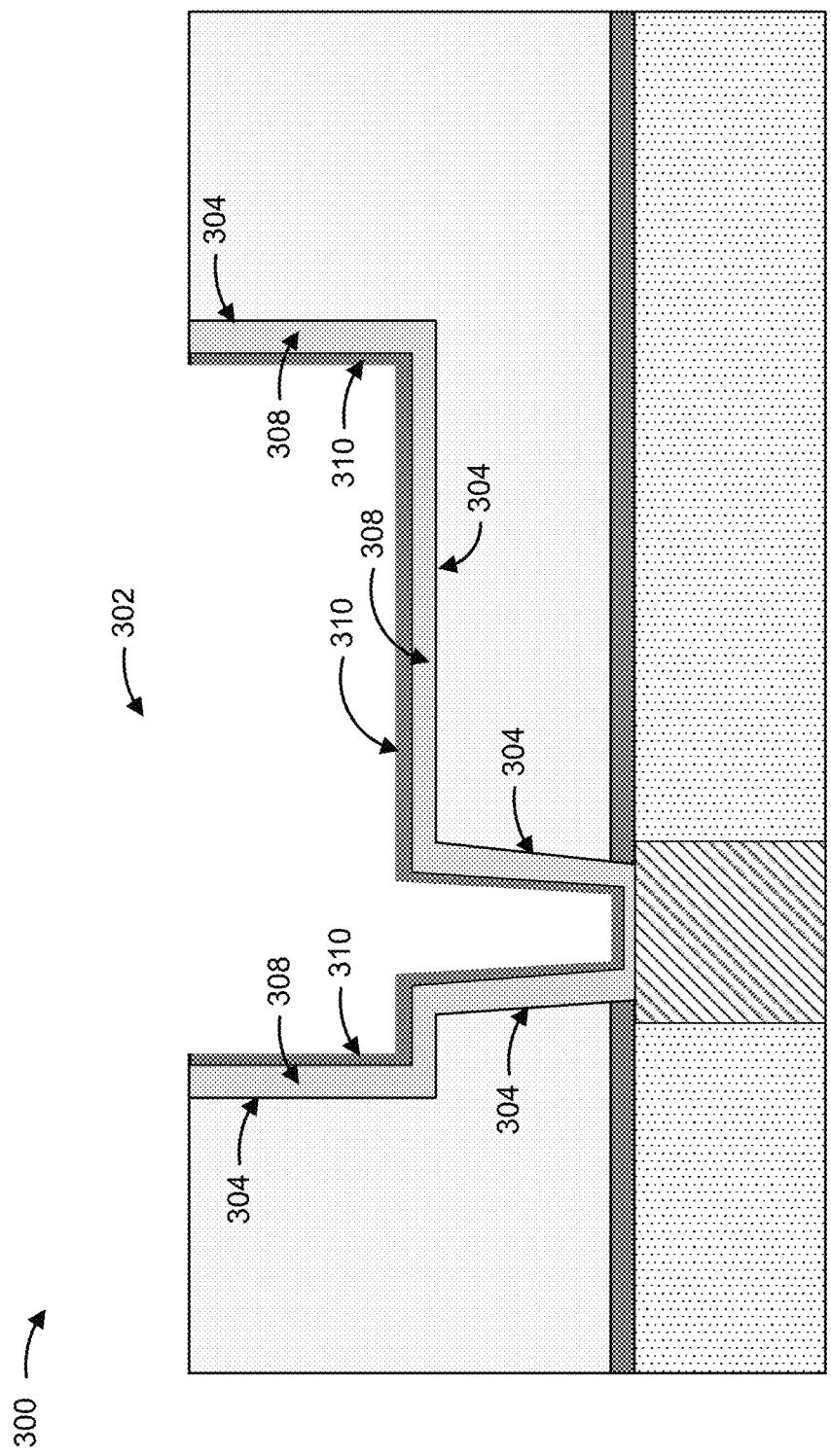

FIG. 3D is a diagram of an example deposition operation. In some implementations, the deposition operation is performed to form a liner 310 on the barrier layer 308. The liner 310 and the barrier layer 308 may be included to reduce, minimize, and/or prevent copper electromigration from BEOL layers that are to be formed on other areas of the semiconductor substrate 160 (which can cause material degradation and device performance reduction). The liner 310 includes cobalt (Co) or another type of metal liner. The liner 310 may be deposited using a CVD technique, a PVD technique, an ALD technique, and/or another deposition technique. Furthermore, and as a result of the deposition tool 100 using the grounding component 172 as described herein, the liner 310 may be free of contaminants and/or particulates.

Figure 3E:
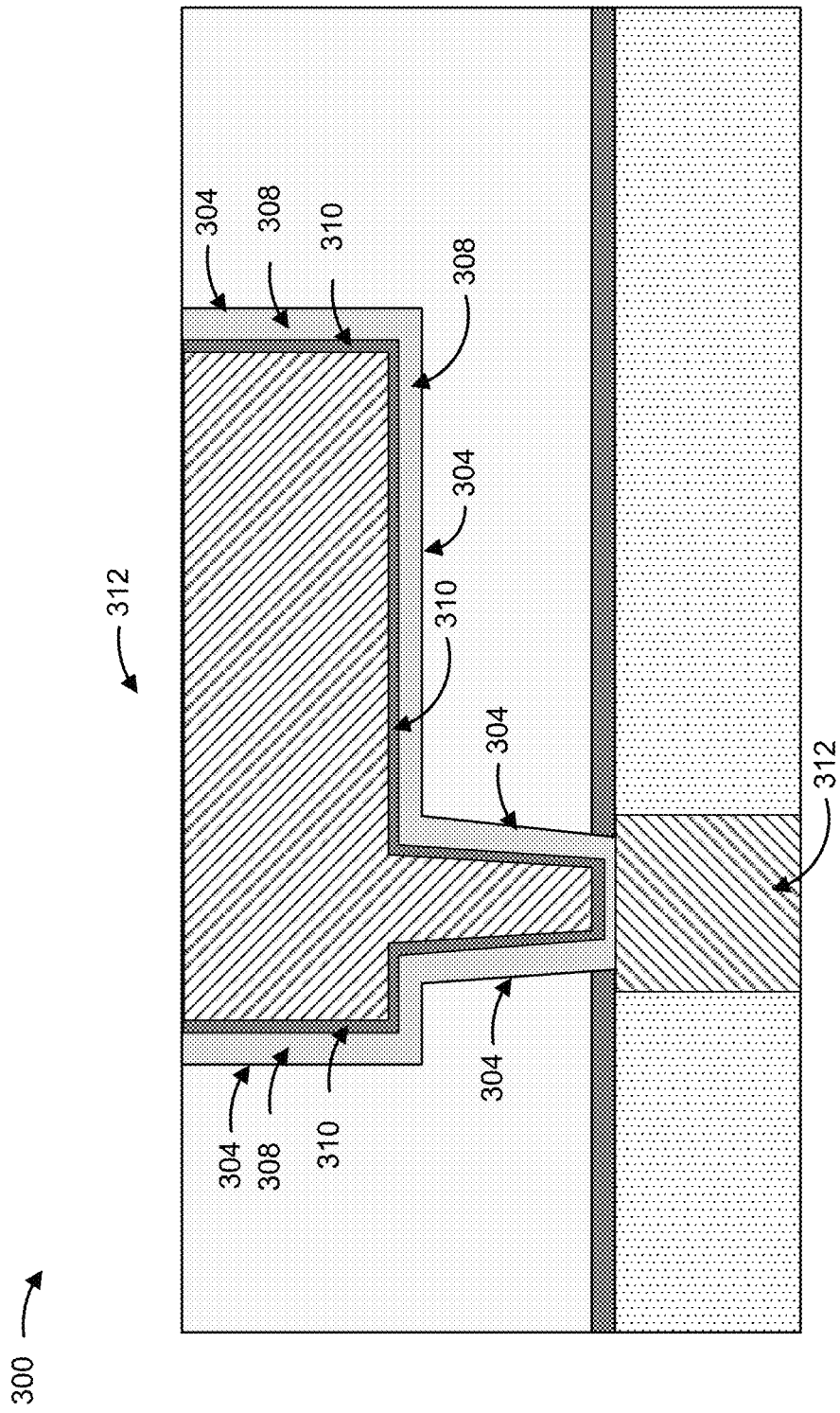

FIG. 3E is a diagram of an example deposition operation. In some implementations, the deposition operation is performed to fill the recess 302 with a conductive material such as copper (Cu) to form a dual damascene structure 312 in the recess 302 over the barrier layers 306 and 308, and over the liner 310. The dual damascene structure 312 may be formed using a CVD technique, a PVD technique, an ALD technique, an electroplating technique, and/or another deposition technique. In some implementations, the dual damascene structure 312 is formed by forming a copper seed layer (or another type of seed layer) on the liner 310, and then filling the remaining portion of the recess 302 over the seed layer to form the dual damascene structure 312.

As indicated above, FIGS. 3A-3E are provided as examples. Other examples may differ from what is described with regard to FIGS. 3A-3E. For example, structures other than the dual damascene structure 312 may be formed using the deposition tool 100 described herein.

Figure 4:
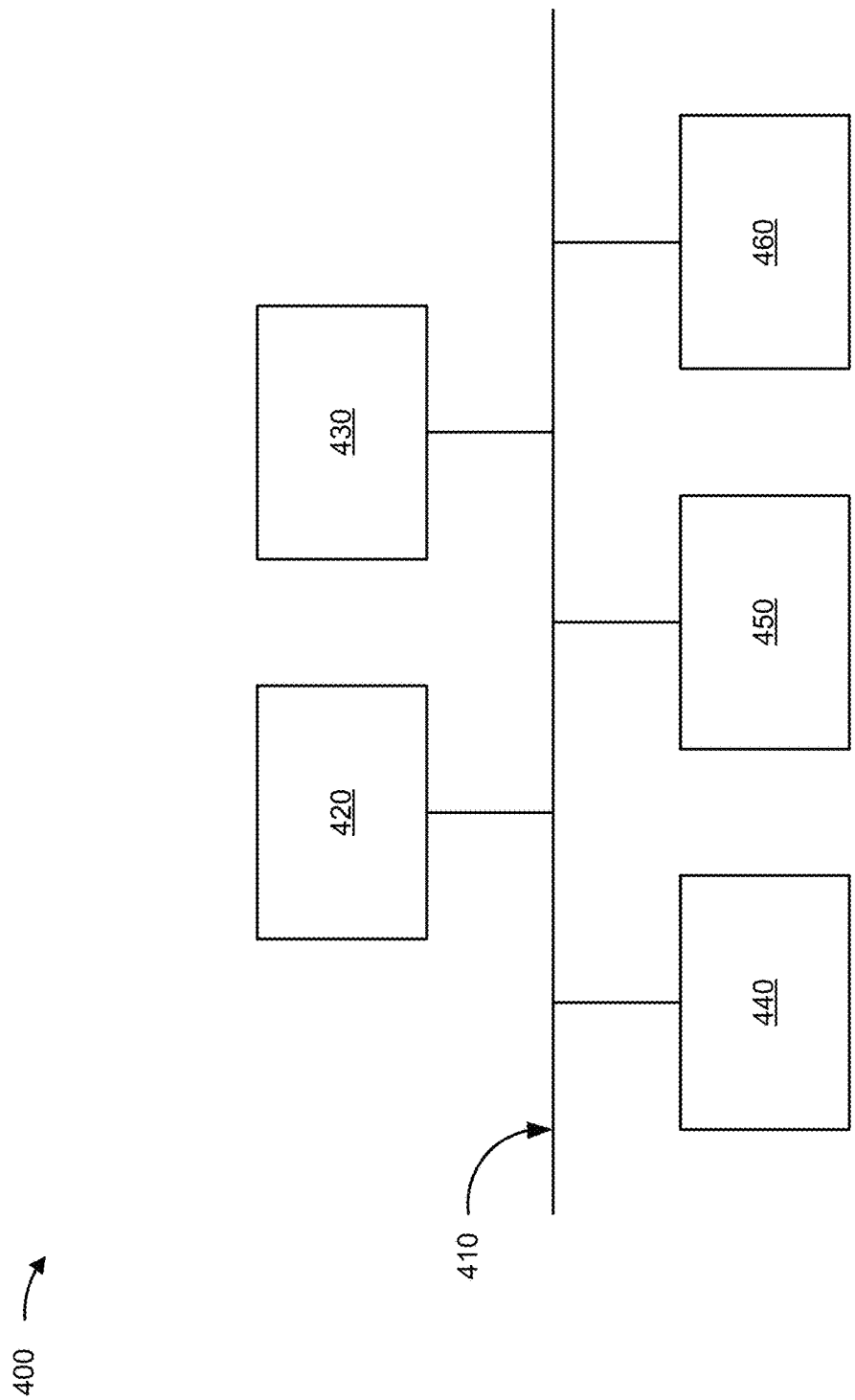
FIG. 4 is a diagram of example components of one or more devices of FIGS. 1A-IC described herein.

FIG. 4 is a diagram of example components of a device 400, which may correspond to the deposition tool 100 and/or the controller 116. In some implementations, the deposition tool 100 and/or the controller 116 include one or more devices 400 and/or one or more components of device 400. As shown in FIG. 4, device 400 may include a bus 410, a processor 420, a memory 430, an input component 440, an output component 450, and a communication component 460.

Bus 410 includes one or more components that enable wired and/or wireless communication among the components of device 400. Bus 410 may couple together two or more components of FIG. 4, such as via operative coupling, communicative coupling, electronic coupling, and/or electric coupling. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform one or more operations or processes described elsewhere herein.

Memory 430 includes volatile and/or nonvolatile memory. For example, memory 430 may include random access memory (RAM), read only memory (ROM), a hard disk drive, and/or another type of memory (e.g., a flash memory, a magnetic memory, and/or an optical memory). Memory 430 may include internal memory (e.g., RAM, ROM, or a hard disk drive) and/or removable memory (e.g., removable via a universal serial bus connection). Memory 430 may be a non-transitory computer-readable medium. Memory 430 stores information, instructions, and/or software (e.g., one or more software applications) related to the operation of device 400. In some implementations, memory 430 includes one or more memories that are coupled to one or more processors (e.g., processor 420), such as via bus 410.

Input component 440 enables device 400 to receive input, such as user input and/or sensed input. For example, input component 440 may include a touch screen, a keyboard, a keypad, a mouse, a button, a microphone, a switch, a sensor, a global positioning system sensor, an accelerometer, a gyroscope, and/or an actuator. Output component 450 enables device 400 to provide output, such as via a display, a speaker, and/or a light-emitting diode. Communication component 460 enables device 400 to communicate with other devices via a wired connection and/or a wireless connection. For example, communication component 460 may include a receiver, a transmitter, a transceiver, a modem, a network interface card, and/or an antenna.

Device 400 may perform one or more operations or processes described herein. For example, a non-transitory computer-readable medium (e.g., memory 430) may store a set of instructions (e.g., one or more instructions or code) for execution by processor 420. Processor 420 may execute the set of instructions to perform one or more operations or processes described herein. In some implementations, execution of the set of instructions, by one or more processors 420, causes the one or more processors 420 and/or the device 400 to perform one or more operations or processes described herein. In some implementations, hardwired circuitry is used instead of or in combination with the instructions to perform one or more operations or processes described herein. Additionally, or alternatively, processor 420 may be configured to perform one or more operations or processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
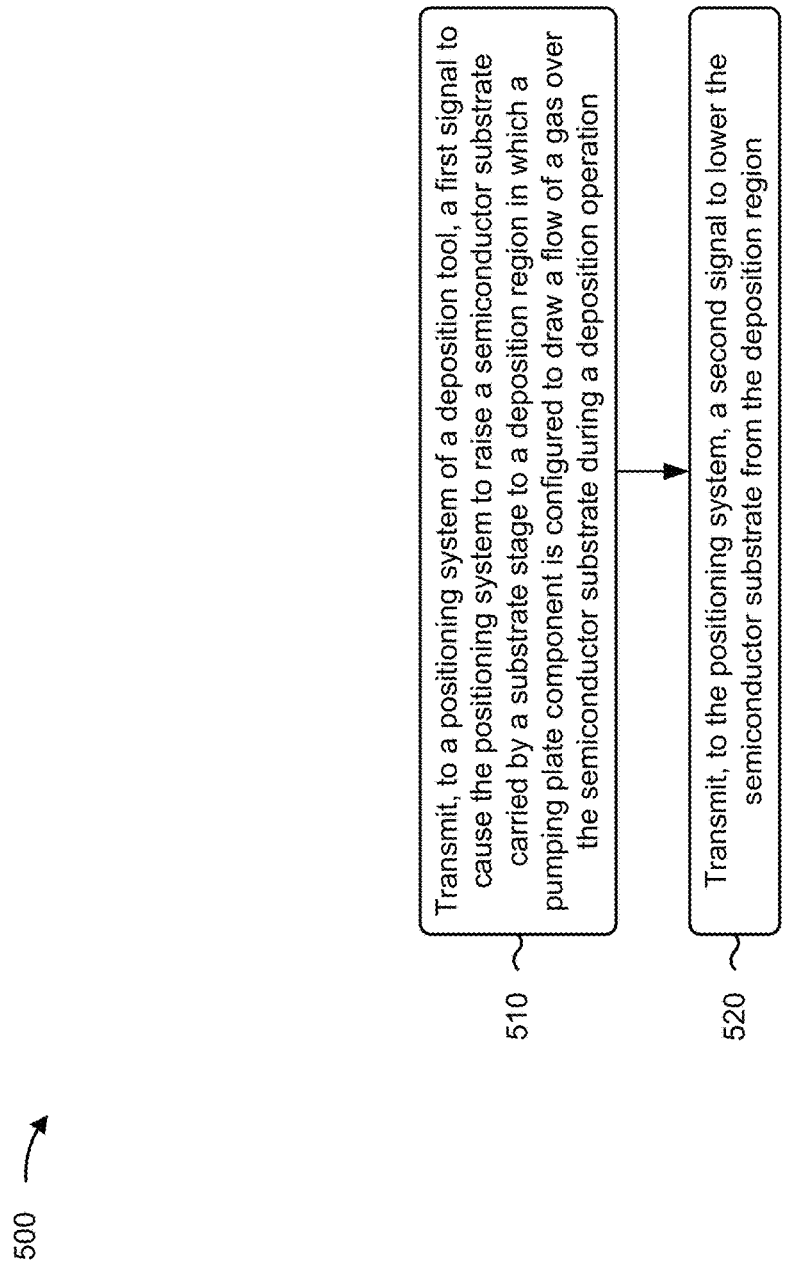
FIG. 5 is a flowchart of an example process associated with performing a deposition operation using the deposition tool described herein.

FIG. 5 is a flowchart is a flowchart of an example process 500 associated with performing a deposition operation using the deposition tool 100 described herein. In some implementations, one or more process blocks of FIG. 5 are performed by a controller (e.g., controller 116). In some implementations, one or more process blocks of FIG. 5 are performed by another device or a group of devices separate from or including the controller, such as the deposition tool 100. Additionally, or alternatively, one or more process blocks of FIG. 5 may be performed by one or more components of device 400, such as processor 420, memory 430, input component 440, output component 450, and/or communication component 460.

As shown in FIG. 5, process 500 may include transmitting a first signal to cause the positioning system to raise a semiconductor substrate carried by a substrate stage to a deposition region in which a pumping plate component is configured to draw a flow of a gas over the semiconductor substrate during a deposition operation (block 510). For example, the controller 116 may transmit a first signal to cause the positioning system 178 to raise a semiconductor substrate 160 carried by a substrate stage 162 to a deposition region 180 in which a pumping plate component 164 is configured to draw a flow of a gas (e.g., the mixed precursor gas 158) over the semiconductor substrate during a deposition operation, as described above. In some implementations, an edge ring 168 is attached to the substrate stage. In some implementations, the edge ring 168 includes a protrusion 170 extending outwardly from an outer perimeter of the substrate stage. In some implementations, a grounding component 172 is between a top-side surface 174 of the protrusion 170 and an under-side surface 176 of an overhang region 166 of the pumping plate component 164. In some implementations, the grounding component 172 includes a grounding strap 202 and a coupling component 204 that couples attach regions 210a, 210b at opposing ends of the grounding strap to form an elliptical portion 206 of the grounding component 172. In some implementations, the grounding strap 202 includes a deformation region 208 including at least one recessed edge 218 along the elliptical portion 206.

As further shown in FIG. 5, process 500 may include transmitting a second signal to lower the semiconductor substrate from the deposition region (block 520). For example, the controller 116 may transmit a second signal to lower the semiconductor substrate 160 from the deposition region 180, as described above.

Process 500 may include additional implementations, such as any single implementation or any combination of implementations described below and/or in connection with one or more other processes described elsewhere herein.

In a first implementation, transmitting the first signal to cause the positioning system to raise the semiconductor substrate 160 is to further cause the grounding strap 202 to become compressed between the top-side surface 174 of the protrusion 170 and the under-side surface 176 of the overhang region 166. In some implementations, becoming compressed engages the deformation region 208 of the grounding strap 202 to the under-side surface 176 of the overhang region 166 to close an electrically-conductive path between the substrate stage 162 and the pumping plate component 164.

In a second implementation, alone or in combination with the first implementation, transmitting the second signal to cause the positioning system 178 to lower the semiconductor substrate 160 is to further cause the grounding strap 202 to become uncompressed between the top-side surface 174 of the protrusion 170 and the under-side surface 176 of the overhang region 166. In some implementations, becoming uncompressed disengages the deformation region 208 of the grounding strap from the under-side surface of the overhang region 166 to open an electrically-conductive path between the substrate stage 162 and the pumping plate component 164.

In a third implementation, alone or in combination with one or more of the first and second implementations, process 500 includes determining a need to service the grounding component 172, and transmitting a third signal to cause a notification system 184 to present an indication of the need to service the grounding component 172.

In a fourth implementation, alone or in combination with one or more of the first through third implementations, determining the need to service the grounding component 172 comprises using a machine-learning model that correlates one or more historical operating conditions of the deposition tool 100 to a likelihood of the grounding component 172 causing a contamination condition. In some implementations, the one or more historical operating conditions correspond to one or more of a number of compressive cycles of the grounding strap 202, a contact resistance between the grounding strap 202 and the under-side surface 176 of the overhang region 164, or a detected contamination condition of the semiconductor substrate 160.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

Some implementations described herein provide a deposition tool that includes a grounding component between an edge ring of a substrate stage and a pumping plate component. The grounding component includes a grounding strap having a deformation region. The deformation region includes a recessed edge to reduce a likelihood of the grounding strap rubbing against a surface of the pumping plate component during operation of the deposition tool. Material properties of the grounding strap may reduce a likelihood of plastic deformation of the grounding strap during repeated cycling.

In this way, an amount of particulates dislodged from the surface of the pumping plate component may be decreased to improve a yield of semiconductor product fabricated using the deposition tool. Furthermore, a frequency of servicing the grounding component may be decreased to decrease a downtime of the deposition tool and increase a throughput of semiconductor product fabricated using the deposition tool.

As described in greater detail above, some implementations described herein provide a method. The method includes transmitting, by a controller to a positioning system of a deposition tool, a first signal to cause the positioning system to raise a semiconductor substrate carried by a substrate stage to a deposition region in which a pumping plate component is configured to draw a flow of a gas over the semiconductor substrate during a deposition operation, where an edge ring is attached to the substrate stage, where the edge ring includes a protrusion extending outwardly from an outer perimeter of the substrate stage, where a grounding component is between a top-side surface of the protrusion and an under-side surface of an overhang region of the pumping plate component, where the grounding component includes a grounding strap and a coupling component that couples attach regions at opposing ends of the grounding strap to form an elliptical portion of the grounding component, where the grounding strap includes a deformation region including at least one recessed edge along the elliptical portion. The method includes transmitting, by the controller to the positioning system, a second signal to lower the semiconductor substrate from the deposition region.

As described in greater detail above, some implementations described herein provide a deposition tool. The deposition tool includes a pumping plate component, where the pumping plate component includes an overhang region extending towards a deposition region of the deposition tool. The deposition tool includes a substrate stage configured to position a semiconductor substrate within the deposition region. The deposition tool includes an edge ring attached to the substrate stage, where the edge ring includes a protrusion extending outwards from an outer perimeter of the substrate stage. The deposition tool includes a grounding component between a top-side surface of the protrusion and an underside surface of the overhang region, where the grounding component includes a grounding strap forming an approximate elliptical shape in a vertical plane between the edge ring and the pumping plate component, and where the grounding strap includes a deformation region having a width that is lesser relative to a width of one or more of a pair of attach regions at opposing ends of the grounding strap.

As described in greater detail above, some implementations described herein provide a grounding strap. The grounding strap includes a first attach region at a first end of the grounding strap. The grounding strap includes a second attach region at a second end of the grounding strap, where the second end is opposite the first end. The grounding strap includes a deformation region between the first attach region and the second attach region, where a first lead-in from a first edge of the first attach region and a second lead-in from a second edge of the second attach region create a recessed edge within the deformation region, and where the first attach region and the second attach region are configured to attach to a protrusion of an edge ring of a deposition tool to create an elliptical portion of a grounding component that includes the recessed edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
transmitting, by a controller to a positioning system of a deposition tool, a first signal to cause the positioning system to raise a semiconductor substrate carried by a substrate stage to a deposition region in which a pumping plate component is configured to draw a flow of a gas over the semiconductor substrate during a deposition operation,
wherein an edge ring is attached to the substrate stage,
wherein the edge ring includes a protrusion extending outwardly from an outer perimeter of the substrate stage,
wherein a grounding component is between a top-side surface of the protrusion and an under-side surface of an overhang region of the pumping plate component,
wherein the grounding component comprises a grounding strap and a coupling component that couples attach regions at opposing ends of the grounding strap to form an elliptical portion of the grounding component, and
wherein the grounding strap comprises a deformation region including at least one recessed edge along the elliptical portion; and
transmitting, by the controller to the positioning system, a second signal to lower the semiconductor substrate from the deposition region.

2. The method of claim 1, wherein transmitting the first signal to cause the positioning system to raise the semiconductor substrate is to further cause the grounding strap to become compressed between the top-side surface of the protrusion and the under-side surface of the overhang region,
wherein becoming compressed engages the deformation region of the grounding strap to the under-side surface of the overhang region to close an electrically-conductive path between the substrate stage and the pumping plate component.

3. The method of claim 1, wherein transmitting the second signal to cause the positioning system to lower the semiconductor substrate is to further cause the grounding strap to become uncompressed between the top-side surface of the protrusion and the under-side surface of the overhang region,
wherein becoming uncompressed disengages the deformation region of the grounding strap from the under-side surface of the overhang region to open an electrically-conductive path between the substrate stage and the pumping plate component.

4. The method of claim 1, further comprising:
determining a need to service the grounding component; and
transmitting a third signal to cause a notification system to present an indication of the need to service the grounding component.

5. The method of claim 4, wherein determining the need to service the grounding component comprises:
   using a machine-learning model that correlates one or more historical operating conditions of the deposition tool to a likelihood of the grounding component causing a contamination condition,
   wherein the one or more historical operating conditions correspond to one or more of:
      a number of compressive cycles of the grounding strap,
      a contact resistance between the grounding strap and the under-side surface of the overhang region, or
      a detected contamination condition of the semiconductor substrate.

6. The method of claim 1, wherein the deformation region has a width that is lesser relative to a width of one or more of the attach regions.

7. The method of claim 1, wherein a first lead-in from a first edge of a first attach region, of the attach regions, and a second lead-in from a second edge of a second attach region, of the attach regions, form the recessed edge.

8. A method, comprising:
   transmitting, by a controller to a deposition tool, a first signal to raise a semiconductor substrate carried by a substrate stage to a deposition region in which a pumping component, comprising an overhang region, is configured to draw a flow of a gas over the semiconductor substrate,
   wherein an edge ring is attached to the substrate stage and includes a protrusion,
   wherein a grounding component is between a top-side surface of the protrusion and an under-side surface of the overhang region,
   wherein the grounding component comprises a grounding strap that comprises a first attach region configured to be attached to the protrusion, a second attach region configured to be attached to the protrusion, and a deformation region between the first attach region and the second attach region,
   wherein a first lead-in from a first edge of the first attach region and a second lead-in from a second edge of the second attach region create a recessed edge within the deformation region; and
   transmitting, by the controller to the deposition tool, a second signal to lower the semiconductor substrate from the deposition region.

9. The method of claim 8, wherein attachment of the first attach region and the second attach region to the protrusion creates an approximate elliptical portion of the grounding component.

10. The method of claim 8, wherein:
   the first attach region comprises a first pair of alignment holes configured to attach the first attach region to the protrusion, and
   the second attach region comprises a second pair of alignment holes configured to attach the second attach region to the protrusion.

11. The method of claim 8, wherein the grounding strap is configured to become compressed between the top-side surface of the protrusion and the under-side surface of the overhang region based on raising the semiconductor substrate.

12. The method of claim 11, wherein compression of the grounding strap closes an electrically-conductive path between the substrate stage and the pumping component.

13. An apparatus, comprising:
   a controller configured to:
      transmit a first signal to raise a semiconductor substrate carried by a substrate stage to a deposition region in which a pumping plate component is configured to draw a flow of a gas over the semiconductor substrate,
         wherein an edge ring, attached to the substrate stage, includes a protrusion extending outwardly from an outer perimeter of the substrate stage,
         wherein a grounding component is between a top-side surface of the protrusion and an under-side surface of an overhang region of the pumping plate component,
         wherein the grounding component comprises a grounding strap that has attach regions at opposing ends of the grounding strap, and
         wherein the grounding strap comprises a deformation region including at least one recessed edge along an elliptical portion; and
      transmit a second signal to lower the semiconductor substrate from the deposition region.

14. The apparatus of claim 13, wherein a property of the grounding strap comprises one or more of:
   a tensile strength greater than approximately 200 megapascals,
   a modulus of elasticity greater than approximately 100 gigapascals,
   a Brinell hardness number greater than approximately 100, or
   an electrical conductivity greater than approximately $0.9 \times 10^6$ siemens per meter.

15. The apparatus of claim 13, wherein a material of the grounding strap comprises:
   a type 301 stainless steel material.

16. The apparatus of claim 13, wherein dimensional properties of the grounding strap comprise:
   a length that is included in a range of approximately 108.9 millimeters to approximately 133.1 millimeters.

17. The apparatus of claim 13, wherein dimensional properties of the deformation region comprise:
   a length that is included in a range of approximately 70.2 millimeters to approximately 85.8 millimeters, or
   a width that is included in a range of approximately 5.9 millimeters to approximately 7.3 millimeters.

18. The apparatus of claim 13, wherein dimensional properties of the deformation region comprise:
   a width that is lesser relative to a width of at least one attach region of the attach regions.

19. The apparatus of claim 13, wherein dimensional properties of the at least one recessed edge comprise:
   a depth that is included in a range of approximately 1.8 millimeters to approximately 2.2 millimeters.

20. The apparatus of claim 13, wherein dimensional properties of at least one attach region of the attach regions comprise:
   a width that is included in a range of approximately 9.6 millimeters to approximately 11.3 millimeters, or
   a length that is included in a range of approximately 18.0 millimeters to approximately 22.0 millimeters.

* * * * *